(12) United States Patent
Chase et al.

(10) Patent No.: US 8,706,699 B2
(45) Date of Patent: Apr. 22, 2014

(54) TRANSACTION HISTORY WITH BOUNDED OPERATION SEQUENCES

(75) Inventors: Scott I. Chase, Pleasanton, CA (US); Jeffrey T. Brubaker, Carboro, NC (US)

(73) Assignee: Synopsys, Inc., Mountain View, CA (US)

( * ) Notice: Subject to any disclaimer, the term of this patent is extended or adjusted under 35 U.S.C. 154(b) by 520 days.

(21) Appl. No.: 12/610,180

(22) Filed: Oct. 30, 2009

(65) Prior Publication Data

US 2011/0016094 A1    Jan. 20, 2011

Related U.S. Application Data

(60) Provisional application No. 61/226,150, filed on Jul. 16, 2009.

(51) Int. Cl.
*G06F 7/00* (2006.01)
*G06F 17/00* (2006.01)

(52) U.S. Cl.
USPC ............... 707/674; 707/703; 707/999.202

(58) Field of Classification Search
None
See application file for complete search history.

(56) References Cited

U.S. PATENT DOCUMENTS

| | | | |
|---|---|---|---|
| 5,123,104 A * | 6/1992 | Levine et al. | 1/1 |
| 6,769,074 B2 * | 7/2004 | Vaitzblit | 714/16 |
| 2003/0101041 A1 * | 5/2003 | Gabele et al. | 703/22 |
| 2004/0068699 A1 * | 4/2004 | Morris et al. | 716/4 |
| 2004/0236984 A1 * | 11/2004 | Yamasaki | 714/6 |
| 2007/0204215 A1 * | 8/2007 | Mueller et al. | 715/514 |
| 2007/0234363 A1 * | 10/2007 | Ferrandiz | 718/101 |
| 2009/0077513 A1 * | 3/2009 | Arsintescu | 716/5 |
| 2009/0150857 A1 * | 6/2009 | Srinivasan et al. | 717/104 |
| 2009/0292383 A1 * | 11/2009 | Bohl et al. | 700/103 |

* cited by examiner

*Primary Examiner* — Azam Cheema
(74) *Attorney, Agent, or Firm* — Park, Vaughan, Fleming & Dowler LLP; Steven E. Stupp

(57) ABSTRACT

A technique for maintaining a transaction history is described. This transaction history includes a sequence of commands or operations in an electronic-design-automation (EDA) environment. For subsets of one or more operations in the sequence of operations, the transaction history includes an associated transaction name, as well as a state of the of the subset, which is open after an initial EDA operation in the subset has been performed and is closed after a last EDA operation in the subset has been performed. This transaction history can be displayed in a window in a graphical user interface, and facilitates undoing and/or rolling back of changes to the data associated with one or more subsets. For example, if an error is detected, roll back of one or more subsets to a known software state or condition prior to the operations in the one or more subsets may be performed without user instructions using the transaction history.

15 Claims, 5 Drawing Sheets

TRANSACTION HISTORY WITH BOUNDED OPERATION SEQUENCES

CROSS REFERENCE TO RELATED APPLICATIONS

This application claims priority under 35 U.S.C. 119(e) to U.S. Provisional Application Ser. No. 61/226,150, entitled "Transaction History," by Scott Ira Chase and Jeffrey Thomas Brubaker, filed on Jul. 16, 2009, the contents of which are herein incorporated by reference.

BACKGROUND

1. Field

This disclosure generally relates to electronic design automation. More specifically, this invention relates to electronic-design-automation software that maintains a transaction history of sequences of one or more electronic-design-automation operations.

2. Related Art

Electronic-design-automation (EDA) software is widely used to design circuits. Typically, EDA software maintains a log file of all the commands or operations performed by a user during a design session, which provides a way for a user to undo, redo or rollback complex operations. However, there are often relationships among groups of operations that are not captured in log files.

For example, a user may perform a sequence of related EDA operations (which are sometimes referred to as a 'transaction'), such as modifying a circuit design by moving multiple objects. Each object that is moved may result in a separate entry or operation in the log file. However, the log file may not include information that indicates how the multiple move operations relate to the overall user purpose (i.e., the transaction).

Consequently, it can be difficult for users to use the information in the log file. In particular, because the log file typically includes a low-level view of the operations performed during a design session, it can be difficult for the user to keep track of the high-level transactions that have been performed.

In addition, many of the operations stored in a log file are implicit to the user's actions, and as such may not be known to the user. This can cause problems when the user attempts to parse the stored operations in a log file in an attempt to determine the associated transactions. Furthermore, while software-development techniques such as checkpoints can be used, the checkpoints are often placed at arbitrary positions, which have no relationship to the transactions.

Therefore, the absence of stored transaction information about sequences of EDA operations may increase the time and effort needed to design circuits, thereby increasing their cost. In addition, the absence of stored transaction information may degrade the user experience, which can impact customer retention and sales of EDA software.

SUMMARY

One embodiment of the present disclosure provides a computer system that maintains a transaction history of an electronic-design-automation (EDA) environment. During operation, the computer system receives an indication that a first transaction has started. Then, the computer system receives one or more user inputs that are associated with a sequence of EDA operations that modifies data, stored in a computer-readable medium, where the data is associated with a circuit design. Moreover, the computer system receives an indication that the first transaction has ended, and associates a first transaction's name with the sequence of EDA operations. Next, the computer system stores the first transaction's name in the transaction history.

Note that the receiving, associating, and storing operations may be repeated for subsequent instances of additional user inputs, thereby maintaining a continuous transaction history.

In some embodiments, the computer system displays information associated with the transaction history in a transaction-history window in a graphical user interface associated with the EDA environment. This transaction-history window may include a temporally ordered list of transaction names, which include the first transaction's name. Furthermore, the transaction-history window may include icons associated with the transaction names, where a given icon in the icons is displayed adjacent to a given transaction name in the transaction names. For example, an icon type of the given icon may correspond to the modifications to the data, thereby providing a graphical indication of the modifications.

In some embodiments, the computer system detects an error associated with the one or more user inputs. Then, the computer system rolls back the sequence of EDA operations, thereby returning the data to a state prior to the sequence of EDA operations, where the roll back is performed without receiving an undo input from a user. Alternatively, the computer system may receive the undo input from the user. In response to the undo input, the computer system may undo the sequence of EDA operations, thereby returning the data to a state prior to the sequence of EDA operations.

Furthermore, the computer system may extract information associated with the sequence of EDA operations prior to undoing the sequence of EDA operations, and may receive a user input to restore a data modification associated with at least a portion of the sequence of EDA operations. In response, the computer system may restore the data modification associated with at least a portion of the sequence of EDA operations, where the restored data modification is populated with the extracted information. For example, the extracted information may include an object name in the circuit design.

Moreover, the indication that the first transaction has started may be automatically generated if an EDA operation is received that is not associated with an ongoing transaction. Additionally, the indication that the first transaction has ended may be automatically generated if a second indication that a new transaction has started is received while the first transaction is ongoing.

In some embodiments, in response to receiving the indication that the first transaction has ended, the computer system renders changes to the circuit design in the graphical user interface associated with the EDA environment, where the changes to the circuit design are associated with the sequence of EDA operations.

Note that the transaction history may be other than a log file, which is associated with EDA software that provides the EDA environment.

Another embodiment provides a method including at least some of the above-described operations.

Another embodiment provides a computer-program product for use in conjunction with the computer system.

Another embodiment provides the graphical user interface associated with the EDA environment. This graphical user interface may include the transaction-history window, which includes the temporally ordered list of transaction names and icons associated with the transaction names. Note that a given icon in the icons may be displayed adjacent to a given transaction name in the transaction names. Furthermore, the given transaction name may be associated with: the sequence of EDA operations, and a state of the sequence of operations. Note that the state is an open state after an indication that an initial operation in the sequence of operations has been performed is received, and where the state is a closed state when another indication that a last operation in the sequence of operations has been performed is received, thereby bounding the sequence of operations.

Figure 1:
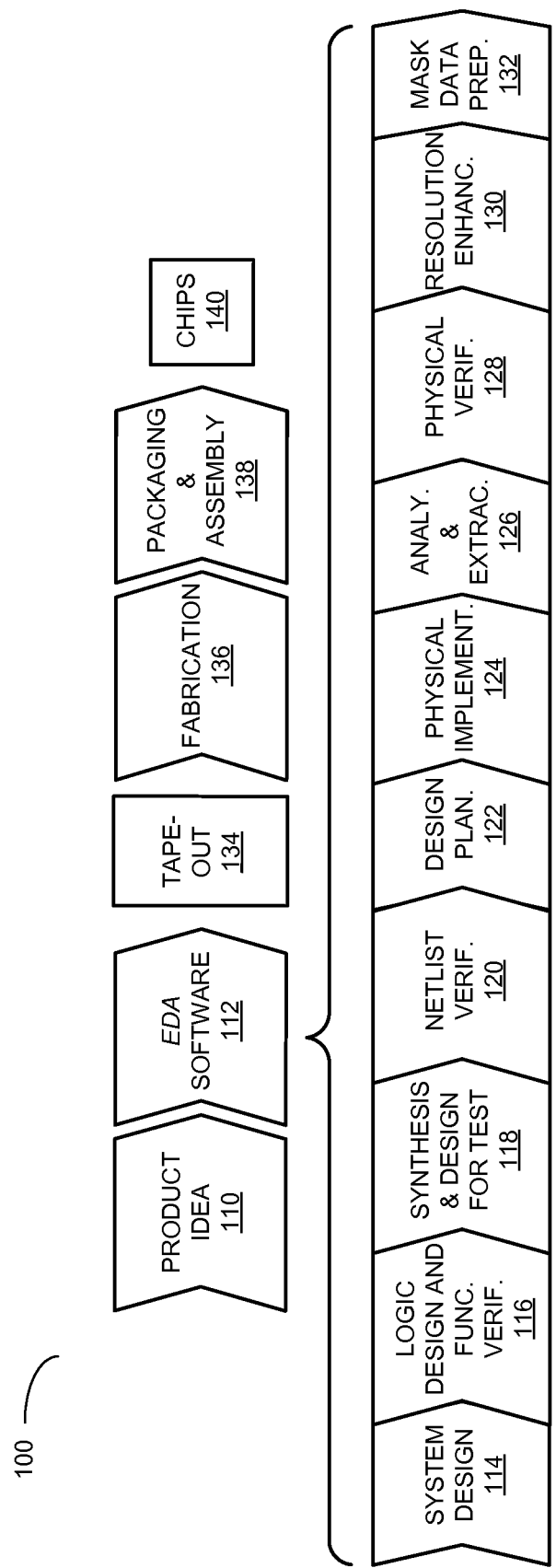
FIG. 1 is a flowchart illustrating various operations in the design and fabrication of an integrated circuit in accordance with an embodiment of the present disclosure.

Table 1 provides pseudo-code in accordance with an embodiment of the present disclosure.

Note that like reference numerals refer to corresponding parts throughout the drawings. Moreover, multiple instances of the same type of part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, and a computer-program product (i.e., software) for use with the computer system are described. During operation, the computer system maintains a transaction history that includes a sequence of commands or operations (which are henceforth referred to as 'operations') in an electronic-design-automation (EDA) environment, which modifies data associated with a circuit design. (In the discussion that follows, the sequence of operations is sometimes referred to as a 'transaction.') For subsets of one or more operations in the sequence of operations, the transaction history includes an associated transaction name, as well as a state of the of the subset, which is open after an initial EDA operation in the subset has been performed and is closed after a last EDA operation in the subset has been performed. This transaction history can be displayed in a window in a graphical user interface to provide a timeline of edits to the design since it was opened. For example, clicking on a transaction name may instruct the computer system to undo one or more events to bring the design back to the state at the time the transaction was closed. Similarly, a user may redo one or more events at a time.

By providing visual information about operations performed in the EDA environment, and by facilitating undo and redo of data changes to a known software state that has meaning to a user, the transaction-history technique helps make the EDA software easier to use, which increases user productivity and lowers circuit development costs. In addition, the transaction-history technique can improve the user experience, and thus, customer retention and sales of EDA software. Furthermore, by providing automatic rollback when unexpected errors are detected, the EDA software may be more robust against unexpected software errors or database consistency issues. Because the EDA environment allows the end-user to execute arbitrary software, note that these advantages may be applied to both supplied code and to user-provided code.

We now describe embodiments of design and fabrication of integrated circuits or chips. FIG. 1 presents a flowchart 100 illustrating the various operations in the design and fabrication of an integrated circuit. This process starts with the generation of a product idea (110), which is realized during a design process that uses EDA software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber®, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® and IC Compiler® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® product.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus® AF, and PSMGED® products.

Additionally, during mask-data preparation (132), the 'tape-out' data for production of masks to produce finished chips is provided. Exemplary EDA software products from Synopsys, Inc. of Mountain View, Calif. that can be used at this stage include the Cats® family of products.

Embodiments of the present disclosure can be used during one or more of the above-described stages. Specifically, in some embodiments the present disclosure can be used in EDA software 112, which may provide a custom schematic editor and simulation environment.

Figure 2:
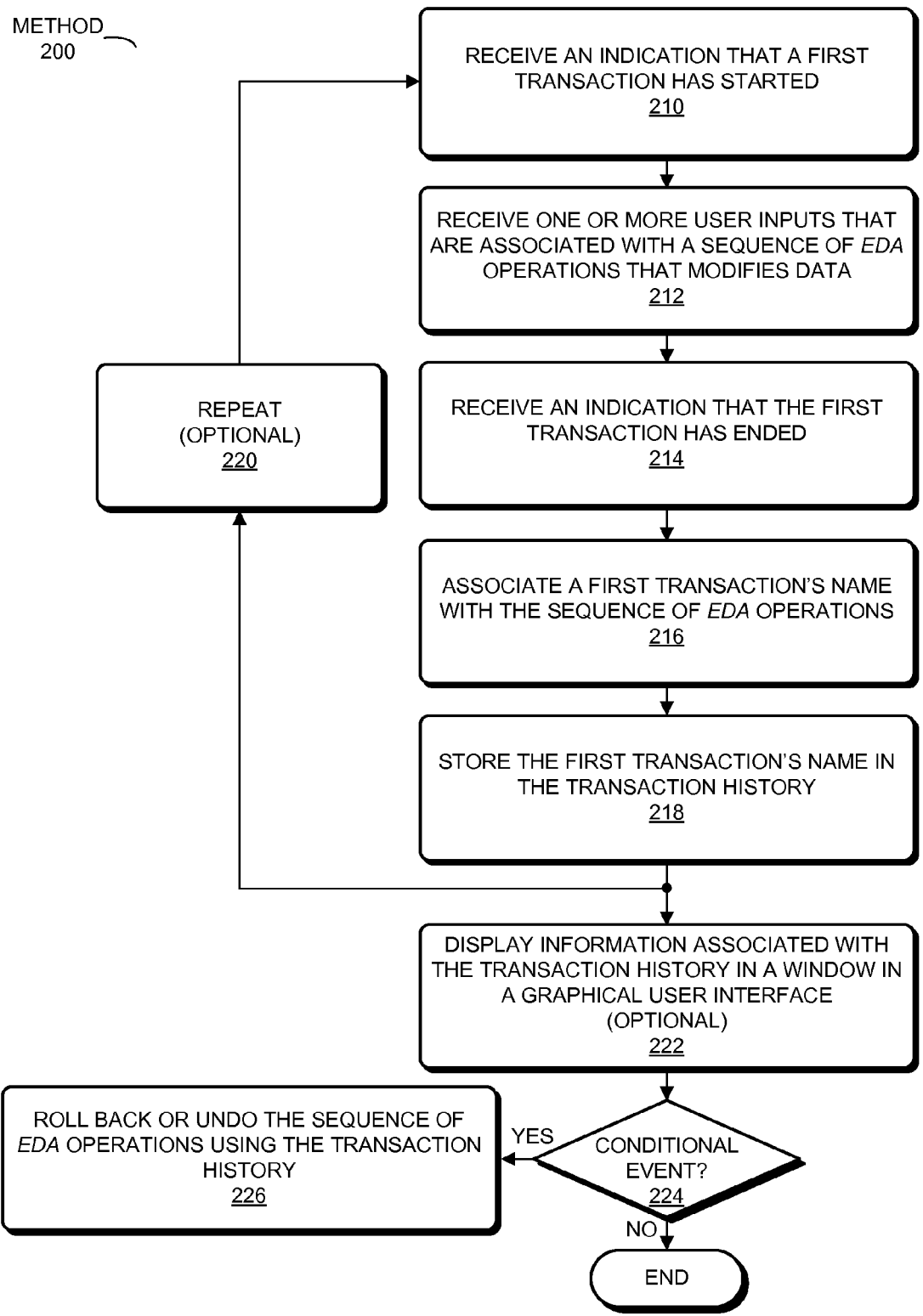
FIG. 2 is a flowchart illustrating a method for maintaining a transaction history of an electronic-design-automation (EDA) environment in accordance with an embodiment of the present disclosure.

We now describe embodiments of a technique for maintaining a transaction history. FIG. 2 presents a flowchart illustrating a method 200 for maintaining a transaction history of an EDA environment, such as that provided by EDA software that executes on a computer system. During operation, the EDA software receives an indication that a first transaction has started (operation 210). Then, the computer system receives one or more user inputs that are associated with a sequence of EDA operations (i.e., a transaction) that modifies data (operation 212), stored in a computer-readable medium, where the data is associated with a circuit design. Moreover, the computer system receives an indication that the first transaction has ended (operation 214), and associates a first transaction's name with the sequence of EDA operations (operation 216). Next, the computer system stores the first transaction's name in the transaction history (operation 218).

Note that the receiving, associating, and storing operations may be optionally repeated (operation 220) for subsequent instances of additional user inputs, thereby maintaining a continuous transaction history.

Figure 3:
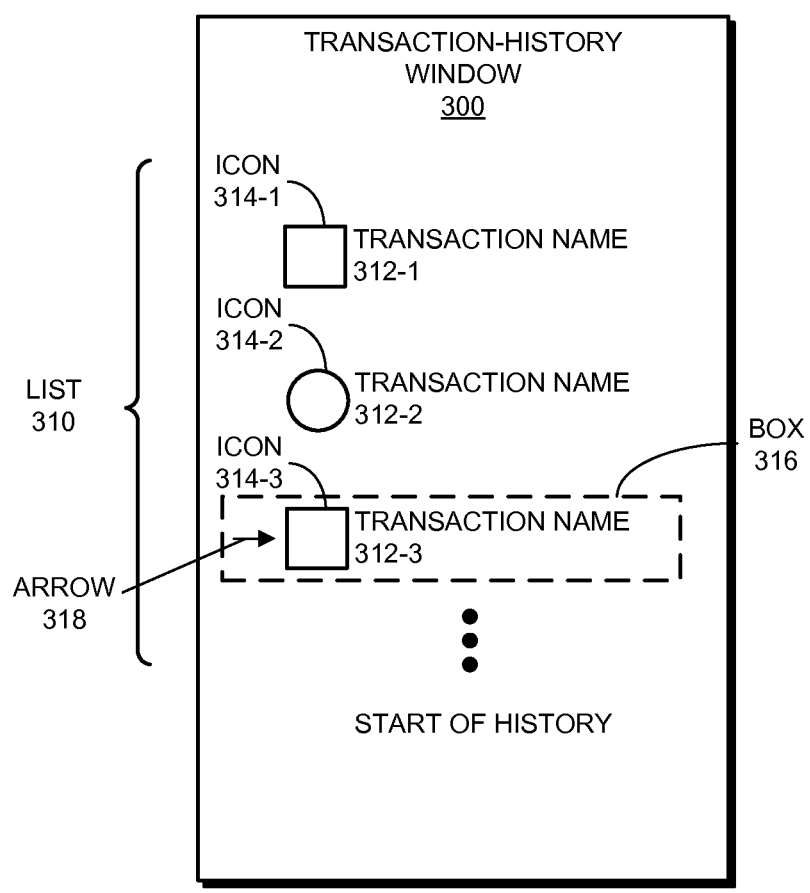
FIG. 3 is a drawing illustrating a transaction-history window in a graphical user interface in accordance with an embodiment of the present disclosure.

As described further below with reference to FIG. 3, in some embodiments the computer system optionally displays information associated with the transaction history in a transaction-history window in a graphical user interface associated with the EDA environment (operation 222). This transaction-history window may include a temporally ordered list of transaction names, which include the first transaction's name. Furthermore, the transaction-history window may include icons associated with the transaction names, where a given icon in the icons is displayed adjacent to a given transaction name in the transaction names. For example, an icon type of the given icon may correspond to the modifications to the data, thereby providing a graphical indication of the modifications.

In some embodiments, the computer system detects a conditional event (operation 224), such as when an error associated with the one or more user inputs is detected. Then, the computer system rolls back the sequence of EDA operations (operation 226), thereby returning the data to a state prior to the sequence of EDA operations, where the roll back is performed without receiving a roll-back input from a user. Alternatively, the conditional event may be an undo input received from the user (operation 224). In response to the undo input, the computer system may undo the sequence of EDA operations (operation 226), thereby returning the data to a state prior to the sequence of EDA operations.

Furthermore, prior to undoing the sequence of EDA operations, the computer system may extract information associated with the sequence of EDA operations. Subsequently, the computer system may receive a user input to restore a data modification associated with at least a portion of the sequence of EDA operations. In response, the computer system may restore the data modification associated with at least a portion of the sequence of EDA operations, where the restored data modification is populated with the extracted information. For example, the extracted information may include an object name in the circuit design.

Moreover, the indication that the first transaction has started may be automatically generated if an EDA operation is received that is not associated with an ongoing transaction. Additionally, if a second transaction is started while a first transaction is ongoing, it may be considered to be a part of the first transaction. This second transaction may not be recorded at all since it is captured by the first transaction. As a consequence, it may be represented as just the first transaction. Note that the first transaction may not be closed until all others are closed. For example, the transactions may include: Transaction 1 started, Transaction 2 started, Transaction 2 ended, Transaction 3 started, Transaction 4 started, Transaction 4 ended, Transaction 3 ended, and Transaction 1 ended. This may be recorded as 'Transaction 1,' and the others may be ignored. This may allow a user to construct more complicated commands, such as 'Route Net 1,' which includes: Create Path on Net 1, Create Via on Net 1 and Create Path on Net 1. In this example, three separate creation commands are used to create one route. If these commands were called independently, each would start/end a transaction. However, because they are called while the 'Route Net 1' transaction is still ongoing, they are ignored and considered to be a part of that transaction.

In some embodiments, in response to receiving the indication that the first transaction has ended, the computer system renders changes to the circuit design in the graphical user interface associated with the EDA environment, where the changes to the circuit design are associated with the sequence of EDA operations. In this way, complicated processes or operations can be deferred until the sequence of EDA operations is completed. For example, if a user deletes multiple objects in a circuit design in a transaction, a renderer may wait to redraw the circuit design until the end of the transaction, thereby increasing the speed of the EDA software.

In some embodiments of method 200 there are additional or fewer operations. Moreover, the order of the operations may be changed and/or two or more operations may be combined into a single operation.

We now describe embodiments of an object, such as the window. FIG. 3 presents a drawing illustrating a transaction-history window 300 in a graphical user interface associated with the EDA environment. This transaction-history window may include a temporally ordered list 310 of transaction names 312 (with the most-recent transactions at the top of transaction-history window 300) and icons 314 associated with the transaction names. These icons may be context dependent, so that they provide a graphically intuitive indication of the meaning of transaction names 312. Furthermore, a given icon (such as icon 314-1) may be displayed adjacent to a given transaction name (such as transaction name 312-1). Additionally, the given transaction name may be associated with the sequence of EDA operations, and the state of the sequence of EDA operations. For example, the state may be 'open' after an indication that an initial EDA operation in the sequence of EDA operations has been performed is received, and the state may be 'closed' after an indication that a last EDA operation in the sequence of EDA operations has been performed is received. However, in other embodiments, transactions are not left open for an extended period. Instead, they are started when a command begins to modify a database and they end when the command is done. Moreover, user input may be collected prior to the command occurring.

In some embodiments, a transaction-history module in the EDA software populates transaction-history window 300 by monitoring events emitted from the EDA software, and in particular, from an undo infrastructure and/or a roll-back infrastructure. These events may indicate when transactions start, end or complete, and when roll-back, undo or restore operations occur. All operations that occur after the given transaction name or non-transaction name has started may be associated with this transaction name until the end time occurs. For example, the sequence of EDA operations associated with transaction name 312-1 may correspond to the creation of multiple objects in a circuit design by a user. Each operation performed by the user (such as creating a rectangular region having a material property, attaching the rectangular region to a net, etc.) may correspond to a separate operation in the sequence of EDA operations. When the last operation in the sequence of EDA operations is performed, transaction-history window 300 may be updated.

Note that the valid operations associated with a given transaction name may include: 'start,' 'end' and 'cancel.' A start operation or call may initiate a sequence of operations that modifies data associated with a specific circuit design, and the resulting transaction may be identified by name (such as transaction name 312-1). Moreover, an end operation may terminate the transaction successfully. Furthermore, a cancel operation may terminate and cancel the transaction, thereby rolling back any changes to the circuit data, and returning the circuit design to the state it had immediately before the transaction started.

As shown in Table 1, which illustrates pseudo-code, in some embodiments, in order to wrap a sequence of EDA operations in a transaction, the user may make a 'start_transaction' call to an undo manager (i.e., the transaction-history module). (More generally, any operation that modifies the circuit data may initiate a start call if a transaction is not already open, i.e., if a stop call occurred for the previous transaction, and a new start call has not occurred yet.) This call may create a transaction object that is used to manage the transaction lifetime and the subsequent termination technique. As noted previously, if an error condition occurs during the sequence of EDA operations, the EDA software may roll back the transaction.

TABLE 1

```
transaction t = undo_manager->start_transaction(undo_container& uc,
             std::string transaction_name);
{
... // client operations which modify data go in here
if (status != 0) {
        t.cancel( );
        messenger->error("Transaction failed!");
        throw( ); // or return TCL_ERROR
}
else {
... // more client operations which modify data go in here
    }
}
t.end_transaction( );
```

In some embodiments, the cancel operation terminates the transaction and causes the undo manager to execute the roll-back operation on the entry in the transaction history that was created, including all the operations in the sequence of EDA operations up to the point when the termination occurred. Then, the roll-back manager may issue a 'TransactionCancel' event. In contrast with a 'normal' undo operation, a cancelled transaction may not be pushed into the transaction history, so it may not be possible to restore it. Furthermore, in some embodiments, once a transaction has been ended, it may not be possible to roll it back. Consequently, transactions that have been ended or rolled back may ignore all subsequent cancel and end calls.

Note that transactions may be localized to or associated with a single circuit design. Consequently, operations that result in correlated changes across multiple circuit designs, such as hierarchical search/replace or global instance rebinding, may create or result in transactions in the multiple circuit designs. Subsequently, the user can independently undo the effect of such an operation in each affected circuit design. However, in some embodiments the user works in multiple designs at the same time, and independent transaction histories may be maintained for each design along with separate current pointers, etc.

By bounding all of the operations in the EDA software, and associating sequences of these operations with names (e.g., transaction names 312), the transaction-history module may facilitate graphical navigation or control of the transactions. For example, transaction-history window 300 may be associated with a dockable assistant in the EDA software. In particular, transaction-history window 300 may provide a way for a user to graphically navigate an undo stack or another data container (either of which is more generally referred to as the 'transaction history'). As shown in FIG. 3, transaction-history window 300 may include one or more indicators, such as a selection box 316 and an arrow 318, that indicate the state of the data in the container. Furthermore, using a mouse to 'click' in the window may change the state. For example, clicking just below an entry may undo the data in the container to a selected state, and clicking just above the entry may restore the data to the previous state. In addition, clicking on the entry 'Start of History' may undo all of the transactions in transaction-history window 300.

Figure 4:
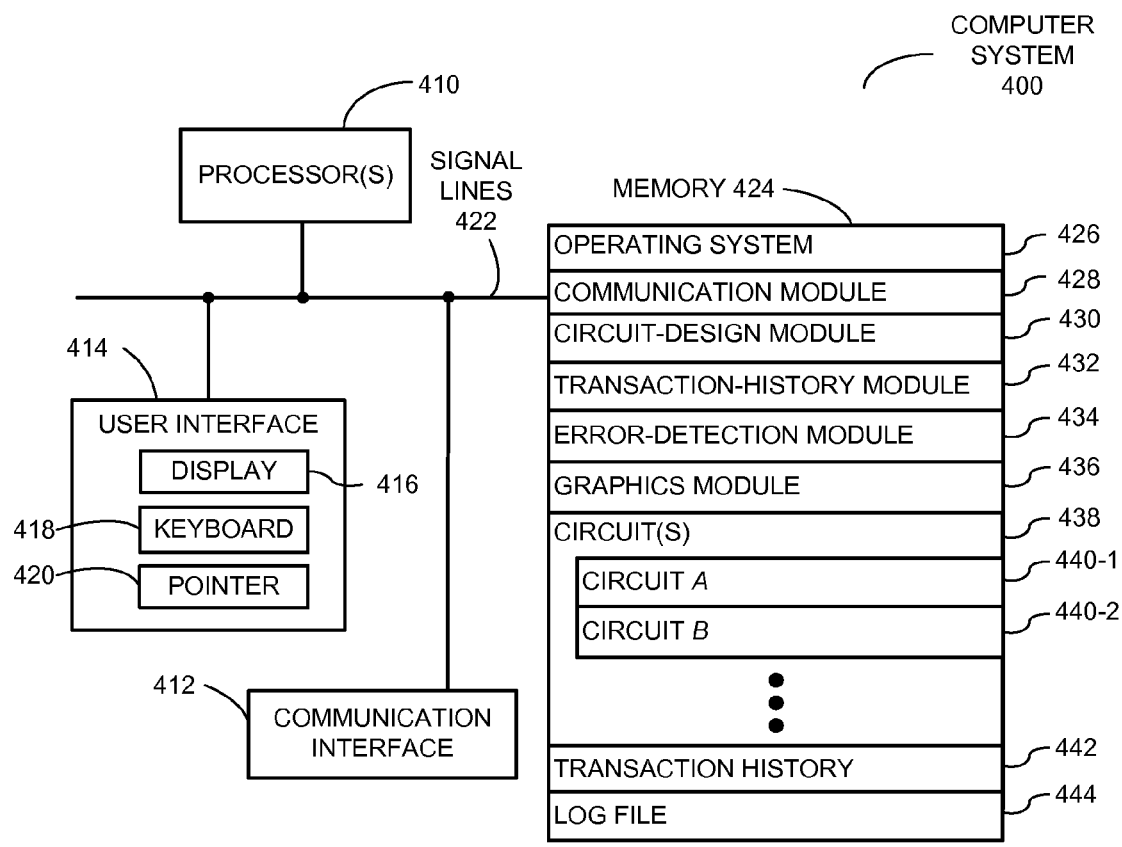
FIG. 4 is a block diagram illustrating a computer system that performs the method of FIG. 2 in accordance with an embodiment of the present disclosure.

We now describe embodiments of a computer system that reliably repeats a sequence of operations. FIG. 4 presents a block diagram illustrating a computer system 400 that performs method 200 (FIG. 2). Computer system 400 includes: one or more processors 410, a communication interface 412, a user interface 414, and one or more signal lines 422 coupling these components together. Note that the one or more processing units 410 may support parallel processing and/or multi-threaded operation, the communication interface 412 may have a persistent communication connection, and the one or more signal lines 422 may constitute a communication bus. Moreover, the user interface 414 may include: a display 416, a keyboard 418, and/or a pointer 420, such as a mouse.

Memory 424 in computer system 400 may include volatile memory and/or non-volatile memory. More specifically, memory 424 may include: ROM, RAM, EPROM, EEPROM, flash, one or more smart cards, one or more magnetic disc storage devices, and/or one or more optical storage devices. Memory 424 may store an operating system 426 that includes procedures (or a set of instructions) for handling various basic system services for performing hardware-dependent tasks. Memory 424 may also store procedures (or a set of instructions) in a communication module 428. These communication procedures may be used for communicating with one or more computers and/or servers, including computers and/or servers that are remotely located with respect to computer system 400.

Memory 424 may also include multiple program modules (or sets of instructions), including: circuit-design module 430 (or a set of instructions), transaction-history module 432 (or a set of instructions), error-detection module 434 (or a set of instructions), and/or graphics module 436 (or a set of instructions). Note that one or more of these program modules (or sets of instructions) may constitute a computer-program mechanism.

During a design session, a user may use circuit-design module 430 to edit or simulate one or more circuits 438 (or circuit designs), such as: circuit A 440-1 and/or circuit B 440-2. When a new sequence of EDA operations occurs (for example, when a user issues a start call or when an operation is performed on one of circuits 438, i.e., the start call may be implicit), transaction-history module 432 may assign a transaction name in transaction history 442, and may store an associated state for this transaction name. Subsequent operations in the sequence of EDA operations may be associated with this transaction name until an the last EDA operation in the sequence of EDA operations is performed. This process may be repeated multiple times for additional sequences of EDA operations. Furthermore, as noted previously, transaction names may be assigned for sequences of EDA operations that modify data for one or more of circuits 438, as well as for any sequences of EDA operations that do not modify data for any of circuits 438.

If error-detection module 434 detects an error for a transaction (such as a transaction for which the state is currently 'open'), transaction-history module 432 may roll this transaction back, thereby returning the state of the circuit data. In some embodiments, a transaction is undone by transaction-history module 432 based on an explicit user request or instruction. Furthermore, transaction-history module 432 may be used to restore a transaction that was undone. In this way, the information in transaction history 442, and in particular, the bounded operation sequences, may be used to change the state of circuit data.

In some embodiments, graphics module 436 is used to visually present the information in transaction history 442 in a window in a graphical user interface that is displayed on display 416. This window may intuitively illustrate the information in transaction history 442, such as transaction names and associated icons. In addition, the user of circuit-design module 430 may graphically navigate through transaction history 442 via this window, for example, by clicking on or selecting entries or icons in the window using: keyboard 418, pointer 420, and/or by touching a screen of display 416 (if display 416 has a touch screen).

Note that transaction history 442 may only persist for the duration of a current design session. Consequently, it may be different than log file 444, which includes a record of all the user operations in multiple design sessions, and which does not include transaction names and/or states associated with sequences of EDA operations. In particular, transaction history 442 may allow complex operations to be represented by a single, higher-level operation (a "transaction"), which can be coupled to undo/redo or automatic database rollback. These features are typically not included in log file 444. Therefore, log file 444 may be maintained independently from transaction history 442 by circuit-design module 430.

Instructions in the various modules in the memory 424 may be implemented in: a high-level procedural language, an object-oriented programming language, and/or in an assembly or machine language. Note that the programming language may be compiled or interpreted, e.g., configurable or configured, to be executed by the one or more processing units 410.

Computer system 400 may include a variety of devices, such as: a personal computer, a laptop computer, a server, a work station, a mainframe computer, and/or other device capable of manipulating computer-readable data.

Although computer system 400 is illustrated as having a number of discrete items, FIG. 4 is intended to be a functional description of the various features that may be present in computer system 400 rather than a structural schematic of the embodiments described herein. In practice, and as recognized by those of ordinary skill in the art, the functions of computer system 400 may be distributed over a large number of servers or computers, with various groups of the servers or computers performing particular subsets of the functions. Consequently, computer system 400 may be at one location or may be distributed across multiple locations, such as computing systems that communicate via a network (such as the Internet or an intranet).

In some embodiments, some or all of the functionality of computer system 400 may be implemented in one or more: application-specific integrated circuit (ASICs), field-programmable gate array (FPGAs), and/or one or more digital signal processors (DSPs). Note that the functionality of computer system 400 may be implemented more in hardware and less in software, or less in hardware and more in software, as is known in the art.

Figure 5:
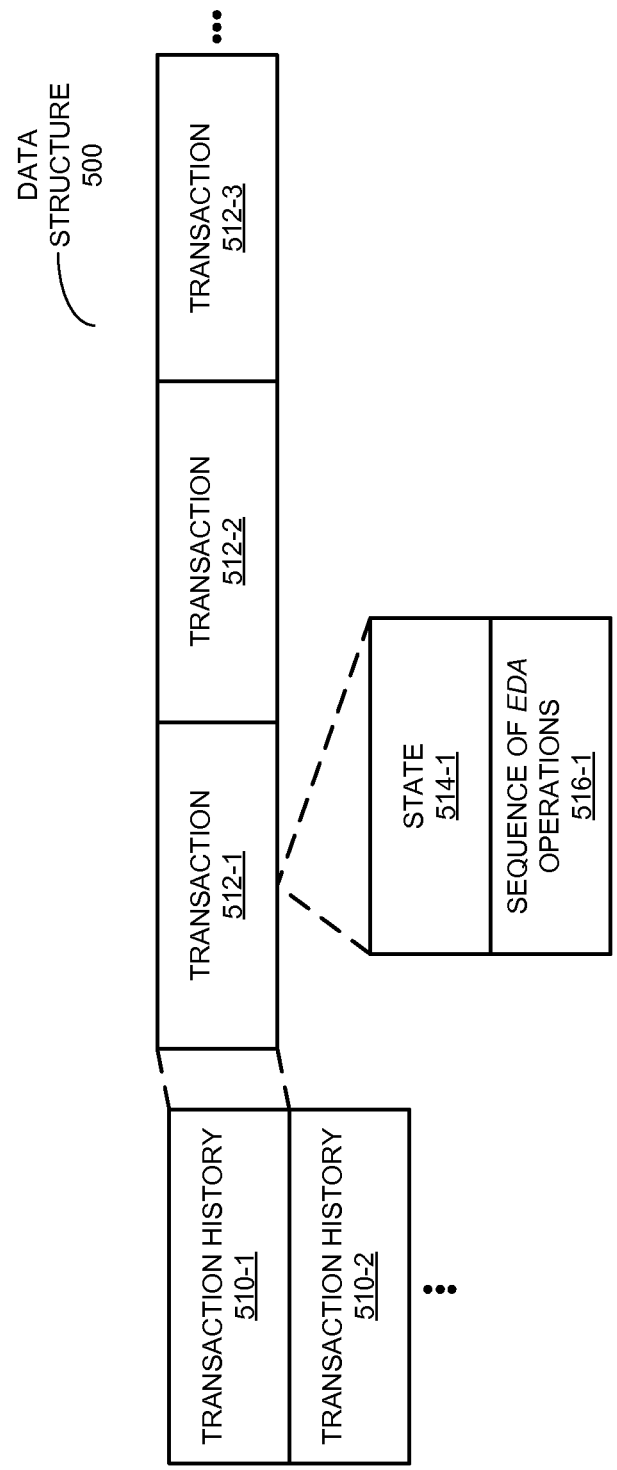
FIG. 5 is a block diagram illustrating a data structure for use in conjunction with the computer system of FIG. 4 in accordance with an embodiment of the present disclosure.

We now discuss embodiments of data structures that may be used in computer system 400. FIG. 5 presents a block diagram illustrating a data structure 500. This data structure may include one or more transaction histories 510, which may be associated with corresponding circuit designs. For example, transaction history 510 may include multiple transactions 512. Furthermore, each transaction, such as transaction 512-1, may include: a state 514-1 (i.e., 'open' or 'closed'), and a sequence of EDA operations 516-1.

In some embodiments, computer system 400 (FIG. 4) and/or data structure 500 include fewer or additional components. Moreover, two or more components may be combined into a single component and/or a position of one or more components may be changed.

While the preceding embodiments have used EDA software as an illustrative example, the technique for maintaining a transaction history may be used with a wide variety of software, including: software applications, software development tools, firmware, operating systems and/or software testing tools.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A computer-implemented method for maintaining a transaction history of an electronic-design-automation (EDA) environment, comprising:
 receiving an indication that a first transaction has started, wherein a transaction is a sequence of EDA operations that includes at least one operation to create, edit, or delete a circuit element in a circuit design;
 receiving a first sequence of EDA operations performed by a first user during a first design session in the EDA environment;
  receiving an indication that the first transaction has ended, wherein the indication that the first transaction has ended is automatically generated if a second indication that a new transaction has started is received while the first transaction is ongoing;
 associating a name for the first transaction with the first sequence of EDA operations;
 storing the name for the first transaction in the transaction history;
 receiving an undo input from a user to undo the first transaction;
 extracting information associated with the first sequence of EDA operations, wherein the extracted information includes an object name in the circuit design;
 rolling back the first sequence of EDA operations, thereby returning the data to a state prior to the first sequence of EDA operations;
 receiving a user input to restore a data modification associated with at least a portion of the first sequence of EDA operations; and
 restoring the data modification associated with at least a portion of the first sequence of EDA operations, wherein the restored data modification is populated with the extracted information.

2. The method of claim 1, wherein the receiving, associating, and storing operations are repeated for subsequent instances of additional user inputs, thereby maintaining a continuous transaction history.

3. The method of claim 1, wherein the method further includes displaying information associated with the transaction history in a transaction-history window in a graphical user interface associated with the EDA environment.

4. The method of claim 3, wherein the transaction-history window includes a temporally ordered list of transaction names, which include the name of the first transaction.

5. The method of claim 4, wherein the transaction-history window includes icons associated with the transaction names; and
 wherein a given icon in the icons is displayed adjacent to a given transaction name in the transaction names.

6. The method of claim 5, wherein an icon type of the given icon corresponds to the modifications to the data, thereby providing a graphical indication of the modifications.

7. The method of claim 1, wherein the method further includes:
 detecting an error associated with the one or more user inputs; and
 rolling back the first sequence of EDA operations, thereby returning the data to a state prior to the first sequence of EDA operations, wherein the roll back is performed without receiving a roll-back input from a user.

8. The method of claim 1, wherein the indication that the first transaction has started is automatically generated if an EDA operation is received that is not associated with an ongoing transaction.

9. The method of claim 1, wherein the method further includes:
 in response to receiving the indication that the first transaction has ended, rendering changes to the circuit design in a graphical user interface associated with the EDA environment, wherein the changes to the circuit design are associated with the first sequence of EDA operations.

10. A computer-program product for use in conjunction with a computer system, the computer-program product comprising a non-transitory computer-readable storage medium and a computer-program mechanism embedded therein for maintaining a transaction history in an EDA environment, comprising:
 instructions for receiving an indication that a first transaction has started, wherein a transaction is a sequence of EDA operations that includes at least one EDA operation to create, edit, or delete a circuit element in a circuit design;
 instructions for receiving a first sequence of EDA operations performed by a first user during a first design session in the EDA environment;
 instructions for receiving an indication that the first transaction has ended, wherein the indication that the first transaction has ended is automatically generated if a second indication that a new transaction has started is received while the first transaction is ongoing;
 instructions for associating a name for the first transaction with the first sequence of EDA operations;
 instructions for storing the name for the first transaction in the transaction history;
 instructions for receiving an undo input from a user to undo the first transaction;
 instructions for extracting information associated with the first sequence of EDA operations, wherein the extracted information includes an object name in the circuit design;
 instructions for rolling back the first sequence of EDA operations, thereby returning the data to a state prior to the first sequence of EDA operations;
 instructions for receiving a user input to restore a data modification associated with at least a portion of the first sequence of EDA operations; and
 instructions for restoring the data modification associated with at least a portion of the first sequence of EDA operations, wherein the restored data modification is populated with the extracted information.

11. The computer-program product of claim 10, wherein the computer-program mechanism further includes instructions for the receiving, associating, and storing operations are repeated for subsequent instances of additional user inputs, thereby maintaining a continuous transaction history.

12. The computer-program product of claim 10, wherein the computer-program mechanism further includes instructions for displaying information associated with the transaction history in a transaction-history window in a graphical user interface associated with the EDA environment.

13. The computer-program product of claim 12, wherein the transaction-history window includes a temporally ordered list of transaction names, which include the name of the first transaction.

14. The computer-program product of claim 10, wherein the computer-program mechanism further includes instructions for:
- detecting an error associated with the one or more user inputs; and
- rolling back the first sequence of EDA operations, thereby returning the data to a state prior to the first sequence of EDA operations, wherein the roll back is performed without receiving a roll-back input from a user.

15. A computer system, comprising:
- a processor;
- memory; and
- a program module, wherein the program module is stored in the memory and configured to be executed by the processor to maintain a transaction history in an EDA environment, the program module including:
- instructions for receiving an indication that a first transaction has started, wherein a transaction is a sequence of EDA operations that includes at least one EDA operation to create, edit, or delete a circuit element in a circuit design;
- instructions for receiving a first sequence of EDA operations performed by a first user during a first design session in the EDA environment;
- instructions for receiving an indication that the first transaction has ended, wherein the indication that the first transaction has ended is automatically generated if a second indication that a new transaction has started is received while the first transaction is ongoing;
- instructions for associating a name for the first transaction with the first sequence of EDA operations;
- instructions for storing the name for the first transaction in the transaction history;
- instructions for receiving an undo input from a user to undo the first transaction;
- instructions for extracting information associated with the first sequence of EDA operations, wherein the extracted information includes an object name in the circuit design;
- instructions for rolling back the first sequence of EDA operations, thereby returning the data to a state prior to the first sequence of EDA operations;
- instructions for receiving a user input to restore a data modification associated with at least a portion of the first sequence of EDA operations; and
- instructions for restoring the data modification associated with at least a portion of the first sequence of EDA operations, wherein the restored data modification is populated with the extracted information.

\* \* \* \* \*